United States Patent
Lee et al.

(10) Patent No.: US 8,957,800 B2
(45) Date of Patent: Feb. 17, 2015

(54) ELECTRONIC SIGNAL CONVERSION APPARATUS AND OPERATION METHOD OF THE ELECTRONIC SIGNAL CONVERSION APPARATUS

(71) Applicant: Electronics and Telecommunications Research Institute, Daejeon (KR)

(72) Inventors: Woo Yong Lee, Daejeon (KR); Jin Kyeong Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/021,237

(22) Filed: Sep. 9, 2013

(65) Prior Publication Data

US 2014/0070967 A1    Mar. 13, 2014

(30) Foreign Application Priority Data

Sep. 10, 2012 (KR) .......... 10-2012-0099810
Aug. 22, 2013 (KR) .......... 10-2013-0099772

(51) Int. Cl.
*H03M 7/30* (2006.01)

(52) U.S. Cl.
CPC .......... *H03M 7/6047* (2013.01); *H03M 7/3062* (2013.01)
USPC ....................................................... 341/155

(58) Field of Classification Search
CPC ............... H03M 1/12; H03M 7/3062
USPC .................................................. 341/122, 155
See application file for complete search history.

(56) References Cited

U.S. PATENT DOCUMENTS

| 7,345,603 B1 * | 3/2008 | Wood et al. .................... 341/122 |
| 8,648,742 B2 * | 2/2014 | Khajehnejad et al. ........ 341/155 |
| 2010/0103008 A1 * | 4/2010 | Raz et al. ...................... 341/120 |
| 2013/0278295 A1 * | 10/2013 | Kim et al. ..................... 327/105 |

FOREIGN PATENT DOCUMENTS

WO    WO 2011135472 A2 *  11/2011

OTHER PUBLICATIONS

Mishali et al., Xampling: Analog Data Compression 2010 IEEE Data Compression conference.*
Yoo et al., A 100MHz-2GHz 12.5x sub-Nyquist rate receiver in 90nm CMOS, 2012 IEEE Radio Frequency Integrated Circuits Symposium (RFIC), Jun. 2012.*

* cited by examiner

*Primary Examiner* — Howard Williams
(74) *Attorney, Agent, or Firm* — Rabin & Berdo, P.C.

(57) ABSTRACT

Provided is an electronic signal conversion apparatus and an operation method of the electronic signal conversion apparatus, including: a first converter to perform a compression and conversion of an input signal to a digital signal based on a first sampling; a second converter to perform a compression and conversion of the input signal to the digital signal based on a second sampling different from the first sampling; and a processor to restore the input signal using an output signal of the first converter and an output signal of the second converter.

4 Claims, 5 Drawing Sheets

ELECTRONIC SIGNAL CONVERSION APPARATUS AND OPERATION METHOD OF THE ELECTRONIC SIGNAL CONVERSION APPARATUS

CROSS-REFERENCE TO RELATED APPLICATION

This application claims the priority benefit of Korean Patent Application No. 10-2012-0099810, filed on Sep. 10, 2012, and Korean Patent Application No. 10-2013-0099772, filed on Aug. 22, 2013 in the Korean Intellectual Property Office, the disclosure of which is incorporated herein by reference.

BACKGROUND

1. Field of the Invention

Embodiments of the present invention relate to an electronic device that may decrease an amount of power used through a digital compression and conversion and an operation method of the electronic device.

2. Description of the Related Art

In the case of using a plurality of wireless interface modules, a conventional wireless communication device may use a large amount of power. Each of the plurality of wireless interface modules generally uses a largest amount of power in a radio frequency (RF) portion corresponding to analog technology.

Unifying analog RFs having different characteristics may be significantly difficult.

To solve the above issue, there is an activity to replace an analog RF with a digital RF However, due to constraints in the development of an analog digital converter and an increase in a signal resolution per sample and sampling frequency, an amount of power used exponentially increases.

Accordingly, there is a need for technology that may decrease an amount of power used in association with an RF.

SUMMARY

An aspect of the present invention provides an electronic device that may decrease an amount of power used through a digital compression and conversion and an operation method of the electronic device.

According to an aspect of the present invention, there is provided an electronic signal conversion apparatus, including: a first converter to perform a compression and conversion of an input signal to a digital signal based on a first sampling; a second converter to perform a compression and conversion of the input signal to the digital signal based on a second sampling different from the first sampling; and a processor to restore the input signal using an output signal of the first converter and an output signal of the second converter.

According to another aspect of the present invention, there is provided an operation method of an electronic signal conversion apparatus, the method including: performing a primary compression and conversion of an input signal to a digital signal based on a first sampling; performing a secondary compression and conversion of the input signal to the digital signal based on a second sampling different from the first sampling; and restoring the input signal using the primarily compressed and converted signal and the secondarily compressed and convert signal.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
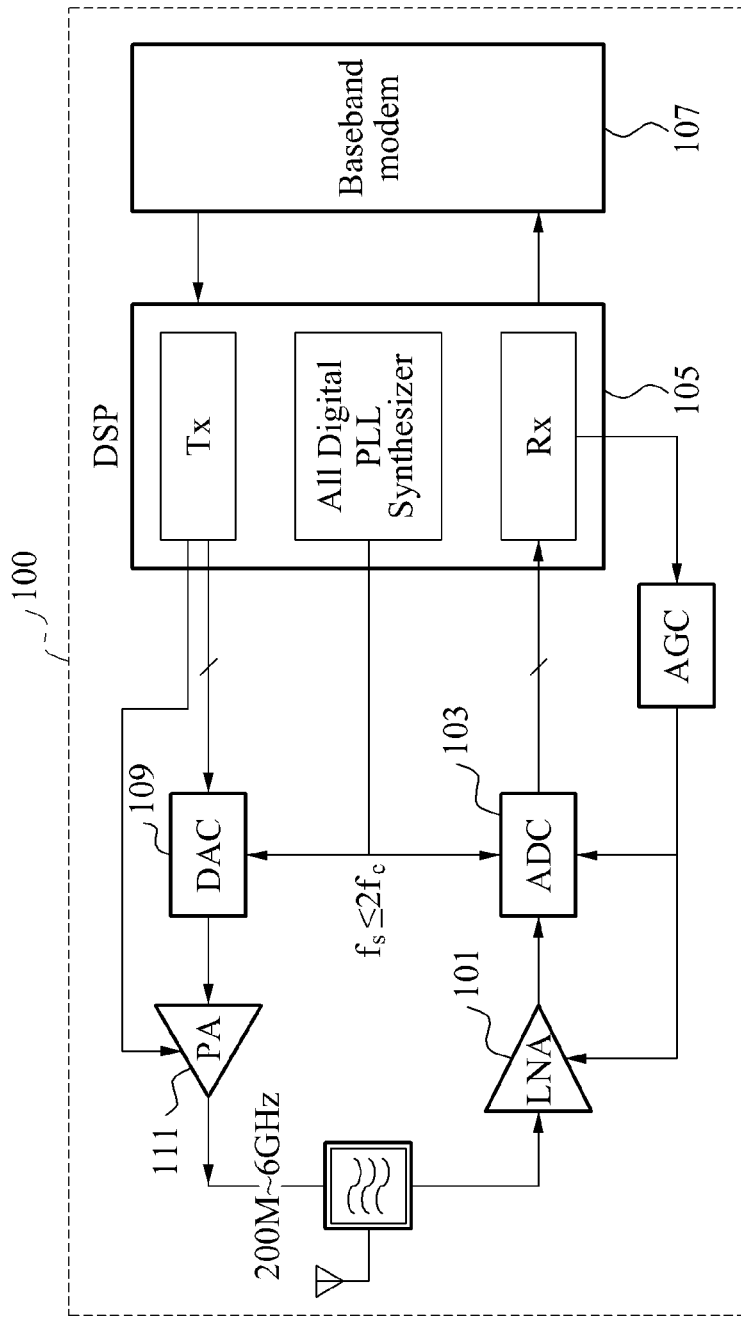
FIG. 1 is a diagram illustrating an example of an electronic signal conversion apparatus according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Hereinafter, an electronic signal conversion apparatus and an operation method of the electronic signal conversion apparatus according to an embodiment of the present invention will be described with reference to the accompanying drawings.

FIG. 1 is a diagram illustrating an example of an electronic signal conversion apparatus 100 according to an embodiment of the present invention.

Referring to FIG. 1, the electronic signal conversion apparatus 100 may include a low noise amplifier (LNA) 101, an analog-to-digital converter (ADC) 103, a digital signal processor (DSP) 105, a baseband modem 107, a digital-to-analog converter (DAC) 109, and a power amplifier (PA) 111.

The LNA 101 refers to a low noise amplifier and may amplify an input signal received through an antenna.

The ADC 103 may convert the amplified signal to a digital signal. Here, the ADC 103 may convert the amplified signal to the digital signal using a compression sensing technology operable in a Shannon Nyquist sampling frequency or less, for example, operable within the range of $f_s < 2f_c$. Here, $f_s$ denotes a sampling frequency and $f_c$ denotes a maximum frequency.

The DSP 105 may generate a raw signal by restoring the signal converted by the ADC 103.

The baseband modem 107 may output the generated raw signal.

The DAC 109 may convert, to an analog signal, a transmission signal received from the baseband modem 107 through the DSP 105. Here, the DAC 109 may convert, to the analog signal, the transmission signal in which the compression sensing technology operable in a Shannon Nyquist sampling frequency or less, for example, operable within the range of $f_s < 2f_c$ is applied.

The PA 111 may amplify the signal converted by the DAC 109 and may transmit the amplified signal through the antenna.

Figure 2:
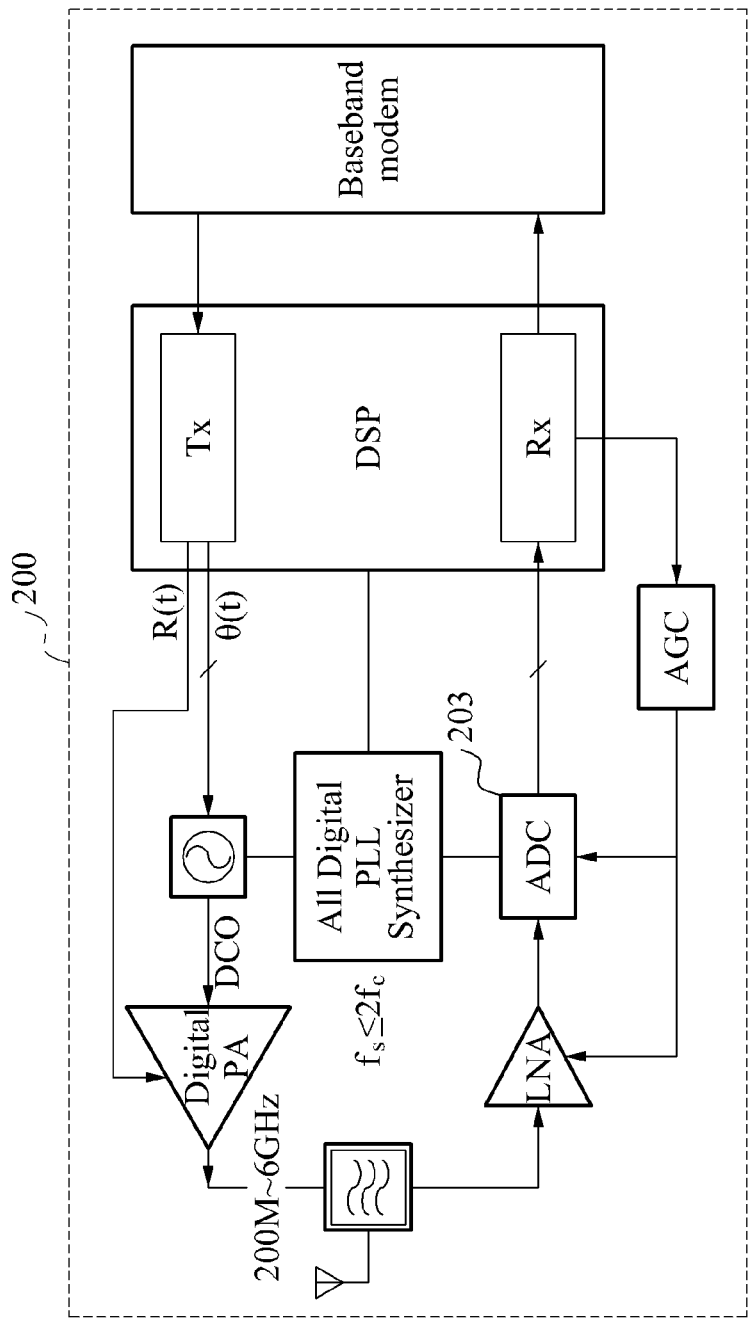
FIG. 2 is a diagram illustrating another example of an electronic signal conversion apparatus according to an embodiment of the present invention.

FIG. 2 is a diagram illustrating another example of an electronic signal conversion apparatus 200 according to an embodiment of the present invention.

A configuration of the electronic signal conversion apparatus 200 is identical to a configuration of the electronic signal conversion apparatus 100 of FIG. 1 and thus, a further detailed description will be omitted here.

Here, in association with a reception portion aside from a transmission portion, the electronic signal conversion apparatus 200 may apply, only to an ADC 203, a compression sensing technology operable in a Shannon Nyquist sampling frequency or less, for example, operable within the range of $f_s<2f_c$ is applied.

Figure 3:
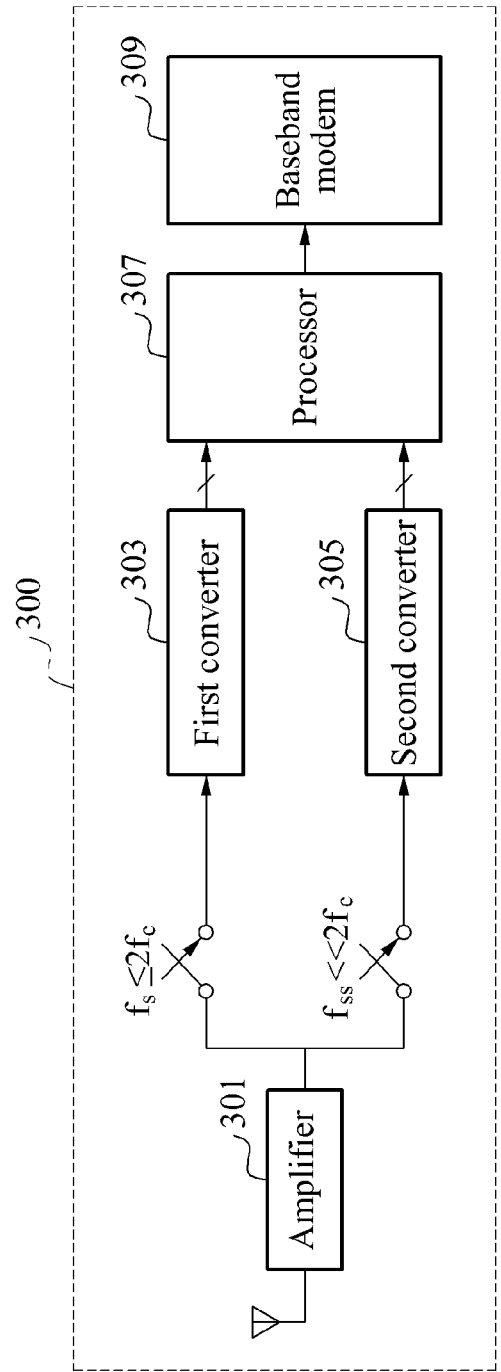
FIG. 3 is a diagram illustrating still another example of an electronic signal conversion apparatus according to an embodiment of the present invention.

FIG. 3 is a diagram illustrating still another example of an electronic signal conversion apparatus 300 according to an embodiment of the present invention.

Referring to FIG. 3, the electronic signal conversion apparatus 300 may include an amplifier 301, a first converter 303, a second converter 305, a processor 307, and a baseband modem 309.

The amplifier 301 may be, for example, an LNA, and may amplify an input signal received through an antenna.

The first converter 303 may be, for example, an ADC, and may perform a compression and conversion of the input signal to a digital signal based on a first sampling. The first converter 303 may sample the input signal based on a low signal resolution of high-speed sampling.

The second converter 305 may be, for example, an ADC, and may perform a compression and conversion of the input signal to the digital signal based on a second sampling different from the first sampling. The second converter 305 may sample the input signal based on a high signal resolution of low-speed sampling. That is, the first sampling may have a relatively high speed and support a relatively low signal resolution compared to the second sampling.

At least one of the first converter 303 and the second converter 305 may decrease an amount of power used by performing sampling in a Nyquist frequency or less, using a compression sensing technology.

The processor 307 may be, for example, a DSP, and may generate a raw signal by restoring the input signal using an output signal of the first converter 303 and an output signal of the second converter 305. Here, prior to restoring the input signal, the processor 307 may perform preprocessing of each output signal using a digital filter or a digital down conversion.

The baseband modem 309 may output the generated raw signal.

The electronic signal conversion apparatus 300 may employ a plurality of converters, for example, the first converter 303 and the second converter 305, to convert the input signal based on samplings each having a different speed and resolution, thereby reducing an integration area in generating a semiconductor.

Figure 4:
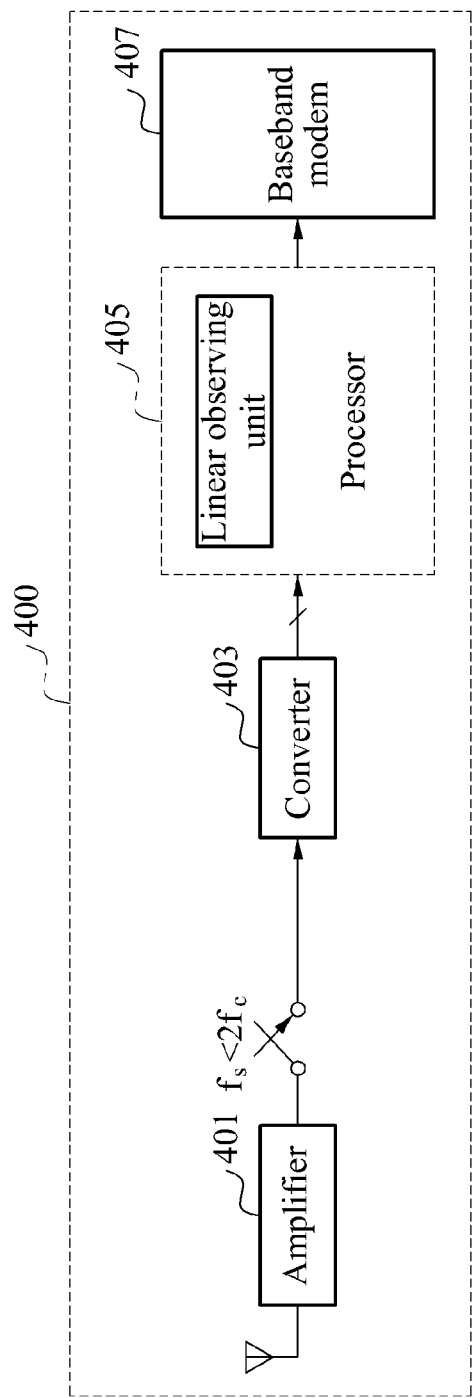
FIG. 4 is a diagram illustrating yet another example of an electronic signal conversion apparatus according to an embodiment of the present invention.

FIG. 4 is a diagram illustrating yet another example of an electronic signal conversion apparatus 400 according to an embodiment of the present invention.

Referring to FIG. 4, the electronic signal conversion apparatus 400 may include an amplifier 401, a converter 403, a processor 405, and a baseband modem 407.

The amplifier 401 may be, for example, an LNA, and may amplify an input signal received through an antenna.

The converter 403 may be, for example, an ADC, and may perform a compression and conversion of the input signal to a digital signal by sampling the input signal. Here, the converter 403 may decrease an amount of power used by performing sampling in a Nyquist frequency or less, using a compression sensing technology.

The processor 405 may be, for example, a DSP, and may generate a raw signal by restoring the input signal using an output signal of the converter 403. Here, the processor 405 may observe the output signal, for example, a sparse signal sampled based on the compression sensing technology using a linear observing unit, and may restore the input signal based on the observation result.

Figure 5:
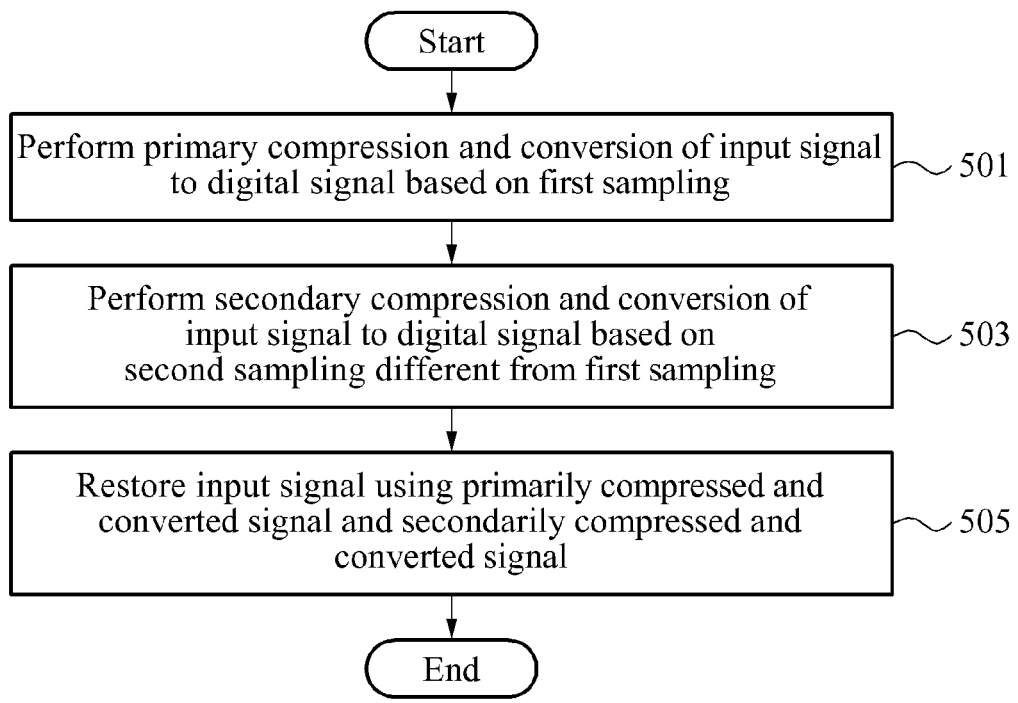
FIG. 5 is a flowchart illustrating an operation method of an electronic signal conversion apparatus according to an embodiment of the present invention.

FIG. 5 is a flowchart illustrating an operation method of an electronic signal conversion apparatus according to an embodiment of the present invention.

In operation 501, the electronic signal conversion apparatus may perform a primary compression and conversion of an input signal to a digital signal based on a first sampling.

In operation 503, the electronic signal conversion apparatus may perform a secondary compression and conversion of the input signal to the digital signal based on a second sampling different from the first sampling.

In the case of performing the compression and conversion, the electronic signal conversion apparatus may convert the input signal to the digital signal using a compression sensing technology operable in a Shannon Nyquist sampling frequency or less, for example, operable within the range of $f_s<2f_c$. Here, $f_s$ denotes a sampling frequency and $f_c$ denotes a maximum frequency. That is, the first sampling or the second sampling may be performed in a Nyquist frequency or less. Here, the first sampling may have a relatively high speed and support a relatively low signal resolution compared to the second sampling.

In operation 505, the electronic signal conversion apparatus may restore the input signal using the primarily compressed and converted signal and the secondarily compressed and convert signal.

According to embodiments of the present invention, there may be provided an electronic apparatus that may decrease an amount of power used through a digital compression and conversion and an operation method of the electronic apparatus.

The units described herein may be implemented using hardware components and software components. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and data may be stored by one or more computer readable recording mediums.

The above-described exemplary embodiments of the present invention may be recorded in non-transitory computer-readable media including program instructions to implement various operations embodied by a computer. The media may also include, alone or in combination with the program instructions, data files, data structures, and the like. Examples of non-transitory computer-readable media include magnetic media such as hard disks, floppy disks, and magnetic tape; optical media such as CD ROM disks and DVDs; magneto-optical media such as floptical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described exemplary embodiments of the present invention, or vice versa.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An electronic signal conversion apparatus, comprising:
   a first converter to perform a compression and conversion of an input signal to a digital signal based on a first sampling;
   a second converter to perform a compression and conversion of the input signal to the digital signal based on a second sampling different from the first sampling; and
   a processor to restore the input signal using an output signal of the first converter and an output signal of the second converter;
   wherein the first sampling has a higher speed and supports a lower signal resolution than does the second sampling.

2. The apparatus of claim 1, wherein the first converter or the second converter performs sampling at less than a Nyquist frequency.

3. An operation method of an electronic signal conversion apparatus, the method comprising:
   performing a primary compression and conversion of an input signal to a digital signal based on a first sampling;
   performing a secondary compression and conversion of the input signal to the digital signal based on a second sampling different from the first sampling; and
   restoring the input signal using the primarily compressed and converted signal and the secondarily compressed and convert signal;
   wherein the first sampling has a higher speed and supports a lower signal resolution than does the second sampling.

4. The method of claim 3, wherein the first sampling or the second sampling is performed at less than a Nyquist frequency.

* * * * *